United States Patent [19]

Satoh et al.

[11] Patent Number: 5,249,100
[45] Date of Patent: Sep. 28, 1993

[54] ELECTRONIC CIRCUIT DEVICE PROVIDED WITH A CERAMIC SUBSTRATE HAVING LEAD PINS BONDED THERETO BY SOLDER

[75] Inventors: Ryohei Satoh, Yokohama; Kazuo Hirota, Chigasaki; Takaji Takenaka, Hadano; Hideki Watanabe, Hadano; Toshinori Ameya, Hadano; Toshihiko Ohta, Hadano, all of Japan

[73] Assignee: Hitachi, Ltd., Tokyo, Japan

[21] Appl. No.: 522,531

[22] Filed: May 11, 1990

[30] Foreign Application Priority Data

May 19, 1989 [JP] Japan .................. 1-124304

[51] Int. Cl.⁵ .............................. H05K 7/20
[52] U.S. Cl. .................... 361/689; 420/507; 361/699; 361/774
[58] Field of Search .............. 361/385, 386–388, 361/400, 406; 427/250; 420/558, 559, 561, 571, 507; 29/626, 840; 117/217

[56] References Cited

U.S. PATENT DOCUMENTS

| | | | |
|---|---|---|---|
| 3,645,785 | 2/1972 | Hentzschel | 117/217 |
| 3,855,693 | 12/1974 | Umbaugh | 29/626 |
| 4,702,941 | 10/1987 | Mitchell et al. | 427/250 |
| 4,918,811 | 4/1990 | Eichelberger et al. | 29/840 |

FOREIGN PATENT DOCUMENTS

| | | | |
|---|---|---|---|
| 253248 | 12/1985 | Japan | 361/385 |
| 61-230204 | 10/1986 | Japan | . |
| 61-236148 | 10/1986 | Japan | . |

*Primary Examiner*—Gregory D. Thompson
*Attorney, Agent, or Firm*—Fay, Sharpe, Beall, Fagan, Minnich & McKee

[57] ABSTRACT

Disclosed is an electronic circuit device in which the solder (14) connecting lead pins (6) to the ceramic substrate (2) has a melting point of 356° C. to 450° C. and has a tensile strength being low in such an extent that a thermal contraction stress generated in a cooling process of the solder (14) from the melting point thereof is low and the substrate (2) does not break. The solder (14) is a Au-Ge alloy containing 10–15 wt % of Ge. Electronic circuit devices, which employ the above solder (14) in the connections, are free from damages in the ceramic wiring substrate (2) due to the bonding. Further, when the electronic circuit device undergoes a series of assembly processes after the above bonding, such solder (14) does not melt, and wettability of such solder (14) is favorable.

9 Claims, 3 Drawing Sheets

ELECTRONIC CIRCUIT DEVICE PROVIDED WITH A CERAMIC SUBSTRATE HAVING LEAD PINS BONDED THERETO BY SOLDER

BACKGROUND OF THE INVENTION

This invention relates to an electronic circuit device provided with a ceramic substrate having lead pins and particularly relates to an electronic circuit device suitable for preventing breakage of the ceramics at the edge portion of the lead pin bonding pad.

In the prior art, silver solder (JIS (Japan Industrial Standards) Z 3261-1976) is used in the bonding of the input/output lead pins of a circuit in which an alumina ceramic substrate is used for securing high strength. With respect to this silver solder, approximately 10 types (melting point of approximately 600° to 800° C.) are known, namely B Ag-1 to B Ag-8A of JIS Z 3261-1976 as shown in Table 1.

TABLE 1

| JIS symbol | Composition (wt %) | | | | | | |
|---|---|---|---|---|---|---|---|
| | Ag | Cu | Zn | Cd | Ni | Sn, Li | Total of other elements |
| B Ag-1 | 44–46 | 14–16 | 14–18 | 23—25 | — | — | 0.15 or less |
| B Ag-1A | 49–51 | 14.5–16.5 | 14.5–18.5 | 17–19 | — | — | Same as above |
| B Ag-2 | 34–36 | 25–27 | 19–23 | 17–19 | — | — | Same as above |
| B Ag-3 | 49–51 | 14.5–16.5 | 13.5–17.5 | 15–17 | 2.5–3.5 | — | Same as above |
| B Ag-4 | 39–41 | 29–31 | 26–30 | — | 1.5–2.5 | — | Same as above |
| B Ag-5 | 44–46 | 29–31 | 23–27 | — | — | — | Same as above |
| B Ag-6 | 49–51 | 33–35 | 14–18 | — | — | — | Same as above |
| B Ag-7 | 55–57 | 21–23 | 15–19 | — | — | Sn 4.5–5.5 | Same as above |
| B Ag-8 | 71–73 | 27–29 | — | — | — | — | Same as above |
| B Ag-8A | 71–73 | Balance | — | — | — | Li 0.15–0.3 | Same as above |

However, in the process of cooling the input/output lead pin after bonding thereof, from a temperature of 600° to 800° C. to room temperature, ceramics at the edge portion of the bonding pad break due to the thermal contraction stress of the solder. Even if the ceramics do not break, a large residual stress remains, thereby posing problems with reliability in service. One cause therefor is that the thermal stress cannot be adequately relaxed on account of the hardness of silver solder. As one method of solving this problem, there is proposed a bonding method by use of a Au-Sn-Ag system solder having a melting point of 280° to 300° C. (See, Japanese Patent Laid-Open 61-236148). However, this solder material is problematic in that it cannot satisfy the hierarchy of bonding temperatures required with Pb-Sn system materials, which are soft solders having melting points of 183° C. to almost 320° C. also used for making other bonding connections in the electronic circuit. In other words, the Au-Sn-Ag solder can not work without melting other solder materials during the assembly process.

Therefore, the prior art in general is problematic in that it can not meet the following three requirements simultaneously:

(1) The prevention of breakage of ceramics at the edge portion of the metallization pad on a ceramic substrate;
(2) The reduction of residual stress in the solder; and
(3) The maintenance of the hierarchy of bonding temperatures with Pb-Sn system solder.

SUMMARY OF THE INVENTION

Therefore, the object of the present invention is to solve the difficult problems of the above described prior art by providing an electronic circuit device having a good hierarchy of bonding temperatures, and ceramics at the edge portion of the lead pin bonding pad unaffected by damage due to thermal stress at the time of lead pin bonding.

In accomplishing the above object in the electronic circuit device of the present invention, the solder, which bonds the lead pin onto the ceramic substrate via the metallization pad, has a melting point of 356° C. to 450° C. At the same time the tensile strength of the solder is low so that the thermal contraction stress generated during the cooling process of such solder from its melting point is also low so that the substrate does not break.

In general, the bonding temperature of Pb-Sn system solder reaches as high as approximately 340° C. Therefore, when the melting point of the above solder used in bonding the lead pin and ceramic substrate is less than 356° C., there is a likelihood that the bonding temperature hierarchy does not hold. Further, when the melting point of the above solder used in bonding the lead pin and ceramic substrate exceeds 450° C., the danger of damaging high molecular resin film, for example, polyamide resin film on the substrate increases. Therefore, it is not desirable that the melting point of the solder used in the present invention be outside of the above temperature range.

Further, the appropriate tensile strength of the above solder used in the present invention can be determined for each alloy system by use of simple experimentation by determining the range in which damages such as crack, etc. are not generated on the ceramic substrate. When the binary system alloy of Au-Ge is used as solder, the appropriate tensile strength range of such solder is approximately 18 to 21 kg/mm$^2$.

Inventors of the present invention have found that a Au-Ge alloy, containing 10 to 15 wt. % of Ge, meets the above requirements and is appropriate for use in the electronic circuit device of the present invention.

As described above, the above object of the present invention can be accomplished by selecting a suitable solder for bonding the lead pin ont the ceramic substrate.

Reasons for restricting the amount of Ge in the Au-Ge alloy solder to the range of 10–15 wt. % employed in the present invention are described below.

FIG. 2 shows an equilibrium diagram of a Au-Ge binary systems (M. Hansen; Constitution of Binary Alloys, 1958, published by McGraw-Hill, Inc.). As can be seen from this equilibrium diagram, Au-12 wt. % Ge is the eutectic composition. Since the melting point is at a constant temperature of 356° C. at this composition, it provides the best point in workability. Using this point as a border, on both sides of the border having either larger or smaller content of Ge, the liquidus temperature rises rapidly, thereby expanding the liquid and solid phase region. This lowers workability. Due to the generation of primary crystal in the cooling process after soldering and generation of a shrinkage cavity at the time of solidification, the structure becomes non-uniform a lowering of toughness can be seen, and the formation of a bond having appropriate and smooth fillet is prevented.

The reasons for restricting the Au concentration to less than 90 wt. % are that the formation of the appropriate fillet form becomes difficult due to the generation of the primary Au crystal and the workability is lowered due to the fact that the liquid phase temperature exceeds eutectic temperature by approximately 100° C. On the other hand, the reasons for restricting the Ge concentration to less than 15 wt. % are for the same reason as in the case of the Au concentration mentioned above and also that primary crystal Ge exceeds 5 volume %, thereby resulting in a rapid drop in toughness.

Au-Ge solder, containing 10 to 15 wt. % Ge, has a low final freezing temperature of approximately 356° C. and a lower tensile strength than Ag solder, so that its thermal contraction stress generated in the process of cooling from a melting point of 356° C. during the bonding process to room temperature is small, thereby prohibiting breakage of the ceramic substrate and also assuring adequate soldering strength.

Effectiveness of the Au-Ge solder can be easily understood from the following dynamic examination. FIGS. 4 and 4A show thermal stress generated in A—A' line on the substrate surface in the cooling process to room temperature after soldering by thermal elastic and plastic analysis using finite element method simulation. From the results thereof, thermal stress generated on the ceramic substrate at the edge portion 13 of the metallization pad (periphery of the pad being covered by ceramics and the pad surface not protruding from the substrate surface shown in Japanese patent Application 1988-283573 was estimated, using such pad as an example, so that it has become apparent that in the case of Ag solder stress in excess of the breaking strength of the substrate is generated for a ceramic substrate of alumina system, a ceramic substrate of mullite system and a glass substrate. However in the case of Au-12% Ge solder, stresses are all below the breaking strength of the substrate. Therefore, Au-Ge solder functions as a solder which prevents breakage of the substrate and which permits good bonding.

The same effects are obtained when the metallization pad is of normal form as shown in FIG. 5.

DESCRIPTION OF THE PREFERRED EMBODIMENTS

Embodiments are explained below by using diagrams and tables.

Figure 1:
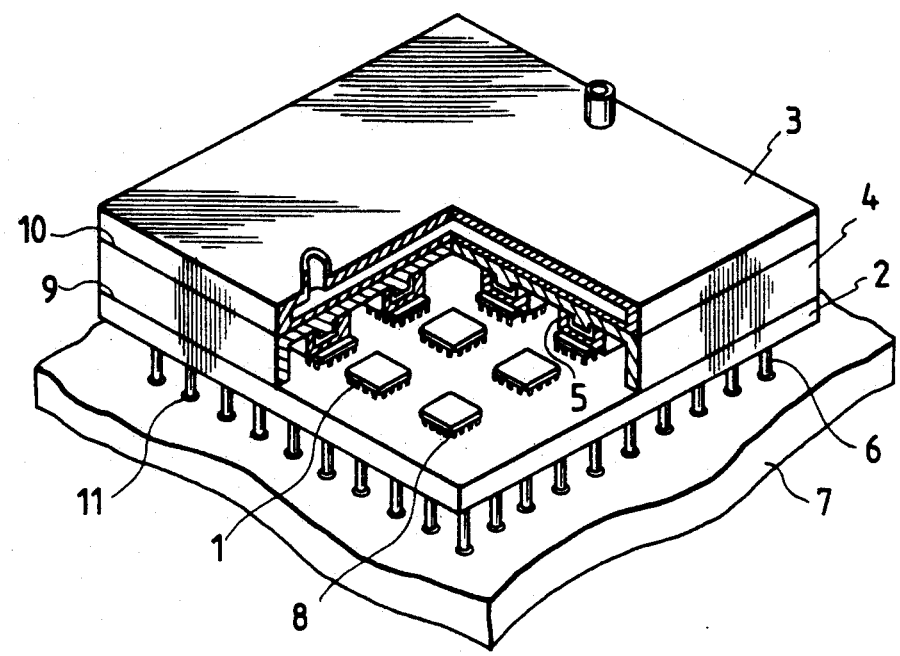
FIG. 1 is a partially cutaway schematic perspective view of the electronic circuit device in one embodiment of the present invention.
Figure 2:
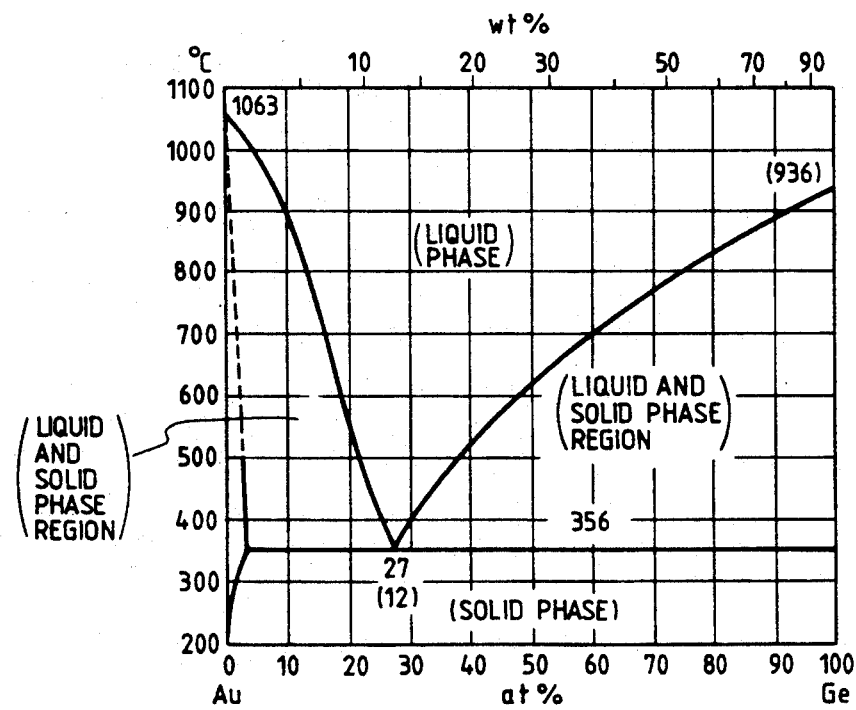
FIG. 2 is a binary system equilibrium diagram of Au-Ge solder used in one embodiment of the present invention.
Figure 3:
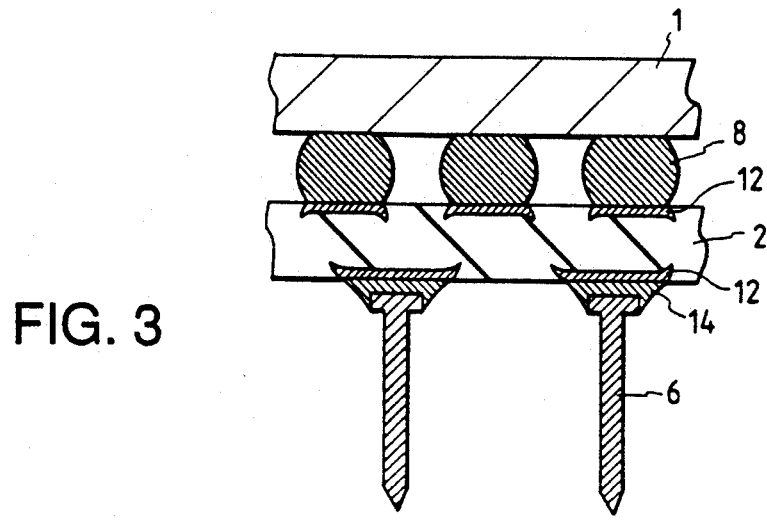
FIG. 3 is a sectional view of the lead pin bonding portion in the electronic circuit device in one embodiment of the present invention.

FIG. 1 shows a scheme of the embodiment of the electronic circuit device having input/output leads and assembled by use of Au-Ge solder. FIG. 3 shows a partial section of the bonding portion of the input/output leads in the embodiment of the electronic circuit device. Table 2 shows comparisons of characteristics of various solders of the present embodiment and the reference examples as well as their bonding quality when such solders are used in bonding input/output leads onto ceramic substrates.

First of all, the present embodiment is explained according to the assembly sequence by using FIG. 1.

On the rear surface of ceramic substrate 2 having a multi-layer interconnection, input/output lead pins 6 are connected by heating and melting Au-12 wt % Ge, Au-10 wt % Ge and Au-15 wt % Ge solders at approximately 400° C., 460° C. and 440° C., respectively. A large number of semiconductor LSI chips 1 were then connected to the front surface of the same ceramic substrate 2 by means of Pb-Sn system fine solder 8 (employed as small ball-shaped form in the present invention) having a melting point of approximately 314° C. and containing 5 wt % Sn and a balance being essentially Pb. The Pb-Sn solder was heated to approximately 325° C., a temperature which does not melt the above Au-12 wt % Ge solder, etc.. Thereafter, cap 4 equipped with heat conduction relaying member 5 was bonded to the same ceramic substrate 2 by use of solder alloy 9, a solder having a still lower melting point than solder 8. Then cap 4 and cooling plate 3 were bonded by use of solder alloy 10, a solder having a still lower melting point than solder 9. Then lead pins 6 were bonded to the wiring board 7 by use of solder alloy 11, a solder having a still lower melting point than solder 10. The electronic circuit was constructed in the above manner.

In constructing the electronic circuit in the above manner, it was necessary that the so-called hierarchy of bonding temperatures be maintained, so that assembly in later processes could be carried out without melting the bonding made in previous processes. Therefore, Au-Ge alloy solders having a melting point in excess of the bonding temperature of a Pb-Sn alloy frequently used in electronic circuits, are necessary for bonding lead pins.

Next, by using FIG. 3, the bonding portion employing Au-Ge solder in the electronic circuit device of FIG. 1 is explained.

In FIG. 3, reference numeral 1 is semiconductor, LSI chip or semiconductor element, reference numeral 14 is the solder of the present invention, reference numeral 12 is the metallization pad, reference numeral 6 the lead pin, reference numeral 8 is other solder, and reference numeral 2 is a ceramic or glass wiring substrate.

Here, an example of bonding an input/output lead pin by use of Au-Ge solder 14 is described. Mullite, alumina and glass were used in the ceramic wiring substrate 2. The mullite has a composition of 57 wt % $Al_2O_3$, 42 wt % $SiO_2$ and 1 wt % MgO, as shown in Japanese Patent Laid-Open 63-230204. The process of forming the bond is described hereafter. Tungsten is baked on the ceramic substrate 2 on which Ni and Au are plated sequentially to form the metallization pad 12. On pad 12 a jig made of carbon and fitted with lead pin 6 and Au-Ge solder is placed in alignment. Solder 14 is melted by heating to a temperature in the range of approximately 360° to 500° C. in a mixed gas atmosphere of nitrogen: hydrogen=1:1, thereby wetting the solder 14 onto the metallization pad 12. Thus, when the temperature is lowered to room temperature at a cooling rate of approximately 0.5° C./sec, it is possible to bond the lead pin without breaking the substrate. The solder 14 can be used in the form of foil or ball or in the form being supplied to the lead pin 6 or the metallization pad 12 of substrate 2 beforehand, by deposition, vacuum evaporation, plating, etc. Further, after this bonding of the lead pin, the semiconductor LSI chip 1 is bonded without melting Au-Ge solder 14 by use of soft solder (Pb-Sn system, Au-Sn system, etc.), having a melting point of approximately 320° C. or less, by heating the solder up to approximately 325° C., thereby obtaining the electronic circuit device shown in FIG. 3.

As described above, the surface of metallization pad 12 is formed of thin Au film plated thereon. When lead pin 6 is bonded by solder 14, this thin Au film melts into the molten solder 14. After completion of the lead pin bonding, the solder 14 is bonded to thin Ni film in metallization pad 12. Further, thin Au film in metallization pad 12 is provided for preventing oxidation of thin Ni film and for protection thereof.

In the present embodiment, the temperature for heating solder 14 is 400° C., a temperature higher than the melting point of Au-12 wt % Ge alloy by 44° C., and a temperature higher by 10° C. than the liquidus temperature of the Au-10 wt % Ge and Au-15 wt % Ge alloys, namely 460° C. and 440° C. respectively.

Furthermore, although the cooling rate was set at 0.5° C./sec in the present embodiment, in the case where soldering is carried out by heating and cooling due to the moving of the specimen in the furnace, a cooling rate of 0.3° C. to 3.5° C./sec is satisfactory.

As a result of examining the strength of the bonds formed in the above manner, adequate strength was shown when compared to the conventional Ag solder formed in a similar manner by having the breakage occurring in the solder. The necessary properties for bonding of the lead pin, including other solders and wiring substrates, are shown in Table 2. Necessary properties of a solder are tensile property, wettability and bonding strength (measured by whether cracks are generated in the ceramic substrate). In Table 2, the solder Nos. 5, 6 and 7 are the preferred embodiments and others are examples for reference. The numerals in the composition of solder Nos. 3 to 9 in Table 2 indicate the wt %. The * mark adjacent to solder Nos. 6 to 8 designates those solders having the liquidus temperature of the alloy composition in the upper column and the solidus temperature of the alloy composition in the lower column.

TABLE 2

| | | | | | Generation of cracks after soldering | | |
|---|---|---|---|---|---|---|---|
| No. | Solder Composition | Melting point (°C.) | Tensile strength (kg/mm$^2$) | Wetta-bility | Mullite substrate | Glass substrate | Alumina substrate |
| 1. | BAg-8 (JIS) | 780 | 42 | o | Yes | Yes | Yes |
| 2. | BAg-7 (JIS) | 620 | 38 | o | Yes | Yes | No |
| 3. | Ag30Cu10Sn | 600 | 35 | o | Yes | Yes | No |
| 4. | Au6Si eutectic | 370 | — | x | No | No | No |
| 5. | Au12Ge eutectic | 356 | 20 | o | No | No | No |
| 6. | Au10Ge | 450/356* | 18 | o | No | No | No |
| 7. | Au15Ge | 430/356* | 21 | o | No | No | No |
| 8. | Au17Ge | 470/356* | 28 | o | No | No | No |
| 9. | Au20sn eutectic | 280 | 15 | Δ | No | No | No |

Wettability was determined by placing a solder of 0.3 mm in diameter on the above metallization pad and melting it at a prescribed temperature, thereby evaluating spreadability of such solder. The atmosphere for melting of the solder is a gas obtained by mixing equal quantities of $N_2$ and $H_2$ wherein no flux was used. Spreadability of the solder was judged by the degree of solder spread on the pad when the solder was melted at a prescribed temperature. Average diameter of the solder spread on the pad was taken as d, and 100 d/0.3 was the measured value (%) showing spreadability. In Table 2, spreads in excess of 150% are designated by a o, whereas spreads of approximately 150% are designated with a Δ, and spreads of less than 150% are designated with an x. When the spreadability is designated by an x, the wettability is poor; when designated by o or Δ, the wettability is favorable. Particularly, when spreadability is designated by 0, wettability is excellent. Wettability is favorable for all of the solders listed in Table 2 except the Au-Si eutectic alloy (solder No. 4). The Au-12 wt % Ge eutectic alloy (solder No. 5) has especially excellent wettability.

On the other hand, with respect to the bonding strength, the presence of cracks was investigated. Results of the investigation revealed that Ag solder (solder No. 1) shown as JIS BAg-8 had generated cracks in all substrates, Ag solder (solder No. 2) shown as JIS BAg-7 and Ag-30 wt % Cu-10 wt % Sn solder (solder No. 3) had generated cracks in mullite and glass substrates. The generation of cracks was not seen in the rest of the solders. Therefore, tensile strength was further investigated. The results of the investigation revealed that there were cases where the bonding easily failed during the chucking work of the tensile testing machine in Au-Si eutectic (solder No. 4)/mullite substrate and Au-Si eutectic/glass substrate, which were combinations failing to generate cracks.

From the results of the foregoing it can be seen that the solders which satisfy all the necessary properties are Au-12 wt % Ge (solder No. 5), Au-10 wt % Ge (solder No. 6), Au-15 wt % Ge (solder No. 7) and Au-20 wt % Sn eutectic (solder No. 9). However, since Au-20 wt % Sn has a low melting point of 280° C., the temperature hierarchy cannot be established to form electronic circuits. Therefore, those solders which conform to the temperature hierarchy with all Pb-Sn system solders are Au-12 wt % Ge eutectic, Au-10 wt % Ge alloy and Au-15 wt % Ge alloy.

On the other hand, from the results of similar investigations made on other compositions of Au-Ge system alloys it was found that, when Ge exceeds 15 wt %, coarse primary crystals of Ge are generated in the bonding process, thereby making the structure non-uniform. This caused problems of increased tensile strength and brittleness in the solder. Therefore, in considering workability as well, the appropriate composition is in the range of Au-10 to 15 wt % Ge.

Figure 4:
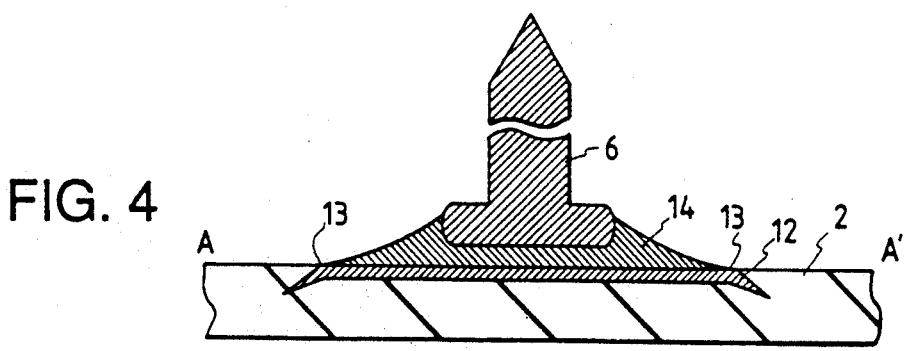
FIG. 4 is a sectional view along line A—A' of the lead pin bonding portion in the electronic circuit device of the present invention; and, FIG. 4A is a diagram showing thermal stress distribution in the lead pin bonding portion and its vicinity in the electronic circuit device of the present invention and also in a comparative example.
Figure 4A:
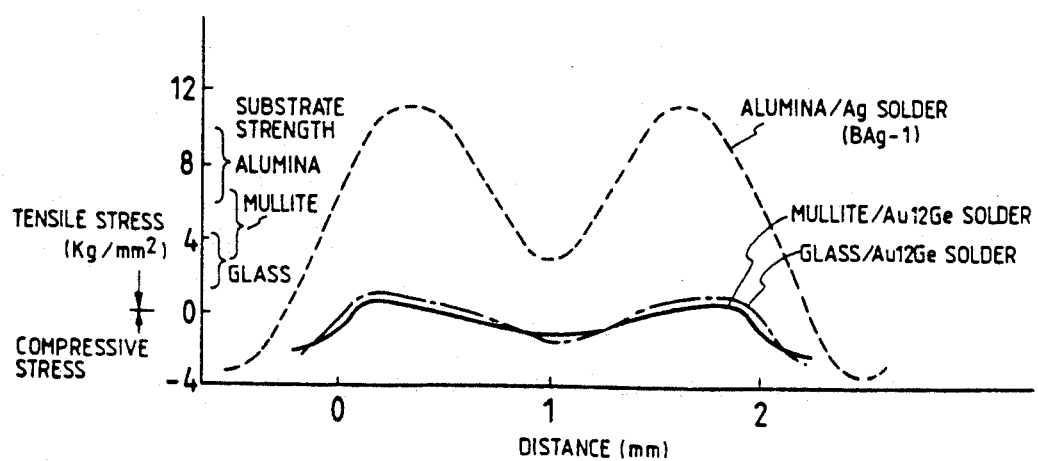
Figure 5:
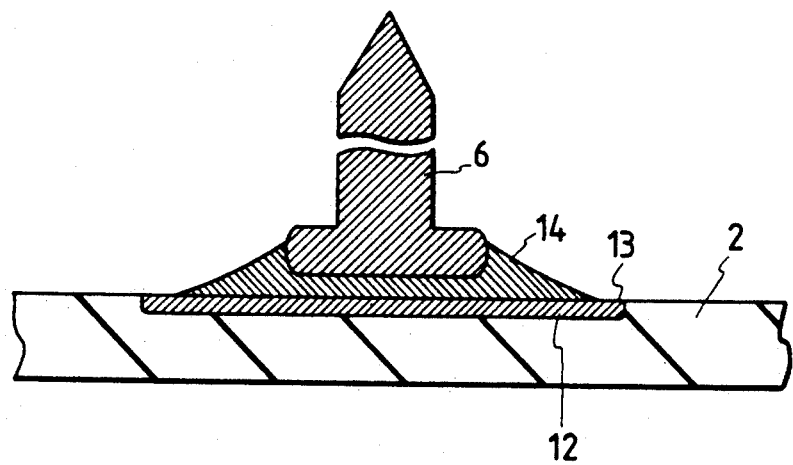
FIG. 5 is a sectional view showing a general example of the lead pin bonding portion in the electronic circuit device of the present invention.

While metallization pads shown in FIG. 3 and FIG. 4 were used in the above embodiment, similar effects as in the above embodiment were obtained when the metallization pads shown in FIG. 5 were used.

The same reference numeral in each of the above drawings indicates materially the same part.

As evident from the foregoing description, according to the present invention, in the electronic circuit device which uses ceramics or glass substrate, there are effects of simultaneously realizing substantial improvement in the bonding characteristics, such as bonding strength and wettability, as well as hierarchy of the bonding temperature and, further, there are effects of greatly contributing toward realization of an electronic circuit device, which tends to increase in both size and density more and more, with high reliability.

What is claimed is:

1. An electronic circuit device comprising:
   a wiring board;
   a wiring substrate;
   lead pins electrically connecting said wiring substrate to said wiring board;
   semi-conductor devices provided on said wiring substrate;
   cap sealing peripheries provided on said semi-conductor devices;
   cooling means provided on said cap sealing peripheries; and,
   a solder connecting said lead pins to said wiring substrate consisting essentially of 10-15 wt. % germanium in a balance being essentially gold, wherein said solder has a melting point of 356° C. to 450° C. and a low tensile strength so that said substrate does not break in a cooling process of said solder from said melting point.

2. An electronic circuit device according to claim 1, wherein said substrate is comprised of mullite system ceramics.

3. An electronic circuit device according to claim 1, wherein said substrate is comprised of alumina.

4. An electronic circuit device according to claim 1, wherein said substrate is comprised of glass.

5. An electronic circuit device according to claim 1, further comprising a second solder which bonds said semiconductor devices to said wiring substrate, a third solder which bonds said cap to said wiring substrate, a fourth solder which bonds said cap to said cooling means, and a fifth solder which bonds said lead pins to said wiring board, wherein said solders have a hierarchy of bonding temperatures so that the melting point of said fifth solder is less than the melting point of said fourth solder, the melting point of said fourth solder is less than the melting point of said third solder, the melting point of said third solder is less than the melting point of said second solder, and the melting point of said second solder is less than the melting point of said first solder.

6. In an electronic circuit device of the type having a ceramic substrate, pads provided on said ceramic substrate, and lead pins bonded to said ceramic substrate via said metallization pads, wherein the improvement comprises:
   a solder connecting said lead pins to said substrate, said solder consisting essentially of 10-15 wt. % germanium and a balance being essentially gold, wherein said solder has a melting point of 356° C. to 450° C. and a low tensile strength so that said substrate does not break in a cooling process of said solder from said melting point.

7. An electronic circuit device according to claim 6, wherein said substrate is comprised of mullite system ceramics.

8. An electronic circuit device according to claim 6, wherein said substrate is comprised of alumina.

9. An electronic circuit device according to claim 6, wherein said substrate is comprised of glass.

* * * * *